United States Patent [19]

Alexandrov et al.

[11] 3,984,524

[45] Oct. 5, 1976

[54] SINGLE CRYSTALS BASED ON STABILIZED ZIRCONIUM DIOXIDE OR HAFNIUN DIOXIDE

[76] Inventors: Vladimir Ilich Alexandrov, ulitsa Ostrovityanova, 31, kv. 291; Vyacheslav Vasilievich Osiko, ulitsa Vavilova, 48, kv. 63; Vladimir Mikhailovich Tatarintsev, Leninsky prospekt, 45, kv. 112; Viktor Timofeevich Udovenchik, Kolomenskoe, ulitsa Bolshaya, 135, all of, Moscow, U.S.S.R.

[22] Filed: Jan. 14, 1975

[21] Appl. No.: 540,795

[52] U.S. Cl. .................................. 423/266; 106/42; 423/608; 331/94.5 F
[51] Int. Cl.$^2$ ................. C01G 25/02; C01G 27/02; C04B 35/48
[58] Field of Search ................ 106/42, 57; 423/266, 423/608; 23/273 SP, 301 SP, 305, 305 RE; 252/301.4 F; 331/94.5 F

[56] References Cited
UNITED STATES PATENTS 3,809,639    5/1974    Faurschov et al. ............... 106/57 X

FOREIGN PATENTS OR APPLICATIONS 2,261,851    7/1974    Germany

OTHER PUBLICATIONS

Alexandrov, V. I. et al., Doklady AN, SSSR, 199, 1282–1283 (1971), "Spectroscopic Properties and Emission in $ZrO_2$ and $HfO_2$ Crystals" (transl. in English, Soviet Physics, Doklady (16) no. 8, Feb. 1972, pp. 657–658.

Alexandrov, V. I. et al., Kratkie Soobschenyia po Fizike, Moscow, No. 11, 1972 "Physical Properties of Crystals Of Hafnium Dioxide and Zirconium Dioxide", pp. 3–7.

Alexandrov, V. I., et al., "Lasing of Thulium$^{+3}$ and Holmium$^{+3}$ Ions in Zirconium Dioxide Crystal" Kratkia Soobschenia poFizike (2), pp. 17–21, 1973.

Alexandrov, V. I. et al., "Molecular Scattering of Light In Hafnium Dioxide Single Crystal", Kristallografiya 18 (5), pp. 1085–1087, 1973.

Barker, W. W. et al., "A High Temperature Neutron Diffraction Study of Pure & Scandia–stabilized Zirconia", J. Solid State Chem. 1973, 7 (4), pp. 448–453.

Koehler, E. K. et al., "Influence of Additions of Rare Earth Oxides on the Polymorphism of Zirconia & Hafnia", Sci. Ceram, 1967, 4, pp. 233–245.

Spitsbergen, U. et al., "Zirconia Solid Solutions With Rare Earth Oxides", Sci Ceram 1967, 4, pp. 247–254.

*Primary Examiner*—Helen M. McCarthy
*Attorney, Agent, or Firm*—Fleit & Jacobson

[57] ABSTRACT

Single crystals based on stabilized zirconium dioxide or hafnium dioxide, wherein used as the stabilizer is scandium oxide or an oxide of one of the rare-earth elements. The content of components in a single crystal is as follows (mol.%):

| | |
|---|---|
| zirconium dioxide or hafnium dioxide | 70–95 |
| stabilizer | 30–5. |

The single crystals of the present invention may also contain coloring agents in an amount of 0.01 to 5% of the single crystal weight.

6 Claims, No Drawings

SINGLE CRYSTALS BASED ON STABILIZED ZIRCONIUM DIOXIDE OR HAFNIUN DIOXIDE

The present invention relates to crystallography, and more particularly to single crystals based on stabilized zirconium dioxide or hafnium dioxide.

The single crystals of the present invention may find application in jewelry as artificial gems, in optical industry as lenses and optical elements, and in quantium electronics as laser elements.

Known in the art are single crystals based on zirconium dioxide or hafnium dioxide stabilized with calcium oxide with the following content of these components (mol.%):

| | |
|---|---|
| zirconium dioxide or hafnium dioxide | 90 |
| calcium oxide | 10. |

These single crystals are impractical because of their poor optical quality (internal waviness, voids), insignificant size and a microhardness in the order of 13,000 MN/m$^2$. The above disadvantages are due to calcium oxide being used as the stabilizer.

It is an object of the present invention to provide single crystals based on stabilized zirconium dioxide or hafnium dioxide, featuring high optical quality, sufficiently big size and improved microhardness.

With this and other objects in view, the invention resides in that used in the proposed single crystals, based on stabilized zirconium dioxide or hafnium dioxide, as the stabilizer is scandium oxide or an oxide of one of the rare-earth elements with the following content of the above components (mol.%):

| | |
|---|---|
| zirconium dioxide or hafnium dioxide | 70–95 |
| stabilizer | 30–5 |

The proposed single crystals have high optical quality (absence of internal waviness, voids), are big enough to find practical use, and possess high microhardness (14,000 to 20,000 MN/m$^2$). They are transparent, have a cubic structure, and may find extensive application.

Recommended for use in optical industry as lenses and optical elements are colourless transparent single crystals in which used as the stabilizer is scandium oxide, samarium oxide, gadolinium oxide, dysprosium oxide, ytterbium oxide or lutecium oxide.

In jewelry, as artificial gems, and in quantum electronics, as laser elements, use should preferably be made of single crystals based on zirconium dioxide or hafnium dioxide stabilized with scandium oxide, samarium oxide, gadolinium oxide, dysprosium oxide, ytterbium oxide or lutecium oxide with the addition of oxides of transition metals, such as cerium oxide, praseodymium oxide, neodymium oxide, europium oxide, holmium oxide, erbium oxide or thulium oxide, and/or oxides of rare-earth elements in an amount of 0.01 to 5% of the single crystal weight.

Ions of the transition metals and rare-earth elements forming part of the oxides being added give the single crystals various colouring, and ions of rare-earth elements are also responsible for different generation characteristics of the single crystals when they are used as laser elements.

When used in single crystals based on stabilized zirconium dioxide or hafnium dioxide as the stabilizer is europium oxide, terbium oxide, holmium oxide, erbium oxide or thulium oxide, it is possible to obtain coloured single crystals with different generation characteristics. For the proposed single crystals to be differently hued, used therein in addition to the above stabilizers should be oxides of transition metals or mixtures thereof in an amount of 0.01 to 5% of the single crystal weight.

When compared to prior art artificial gems based on alumina (ruby, sapphire, alexandrite, etc) containing oxides of transition metals as the colouring agent, the proposed single crystals feature a number of substantial advantages. They have a higher refraction index (in the proposed single crystals $n = 2$–$2.2$, which is slightly inferior to diamond in which $n = 2.4$, but superior to sapphire and ruby with $n = 1.7$), hence richer lustre. Moreover, the proposed single crystals have a wider range of hues (in addition to oxides of transition metals, the above-mentioned oxides of rare-earth elements may also be introduced into the proposed single crystals).

As is well known, one of the basic requirements imposed on artificial gems in their hardness. In this respect, the proposed single crystals are far superior in hardness than quartz (1.5 times), are comparable with single crystals of yttrium-aluminium garnet, and have, as has been mentioned above, a microhardness of 14,000 to 20,000 MN/m$^2$.

The proposed single crystals based on stabilized zirconium dioxide or hafnium dioxide are prepared as follows.

First, a charge is prepared from zirconium dioxide or hafnium dioxide and a stabilizer. In this case, used as the stabilizer is scandium oxide or an oxide of one of the rare-earth elements, such us samarium oxide, europium oxide, gadolinium oxide, terbium oxide, dysprosium oxide, holmium oxide, erbium oxide, thulium oxide, ytterbium oxide or lutecium oxide. The stabilizer is taken in the ratio 30–5 : 70–95 (mol.%) to zirconium dioxide or hafnium dioxide, respectively. The prepared charge is melted and single crystals are grown from the resulting melt by the Stockbarger method (cf. D.C. Stockbarger, Rev. Sci. Insts., 7, 133 (1936)).

The use of oxides of the above metals as the stabilizer makes it possible to obtain big single crystals featuring high optical properties (high refraction index and broad passband, absence of internal waviness and voids), as well as high microhardness.

The charge including zirconium dioxide or hafnium dioxide and a stabilizer is then loaded into a container arranged as a plurality of water-cooled cooper tubes. The bottom portion of the container also comprises a plurality of such tubes.

Prior to melting, locally introduced into the charge loaded into the container is the additive of metallic zirconium, hafnium, scandium or one of the rare-earth elements: samarium, gadolinium, dysprosium, ytterbium, lutecium, thulium, europium, terbium, holmium, or erbium, in an amount of 0.01 to 1 wt %.

In this case, if the charge is based on zirconium dioxide, it is preferable to introduce thereinto metallic zirconium or a metal same as that of the stabilizer being used, while in the case of the charge being based on hafnium dioxide, introduced into the charge should be metallic hafnium or a metal same as that of the stabilizer.

These additives are introduced into the charge to effect its starting (initial) melting. In the process of melting, said additives turn to respective oxides.

The composition of the charge before and after introducing the metallic additive thereinto is adjusted according to the type and amount of the additive being introduced.

The adjustment of the charge composition is effected so as to maintain the ratios between the starting components within the above-mentioned limits.

The charge is melted in the container in an HF electric field, with the container being cooled with water fed into the tubes. Used as the source of electrical energy is an HF generator with a generation frequency of at least 300 kHz. The energy of the generator HF oscillations is applied to an induction coil, then partially absorbed by the additive of metallic zirconium, hafnium or one of the above-mentioned metals of Group III, locally introduced into the charge. In this case, the metallic additive is melted and oxidized to produce the required oxide.

Under the effect of local heating, that portion of the charge which contacts with the metallic additive is melted (initial melting of the charge). The melted portion of the charge absorbs the generator HF oscillation energy and the melting zone goes on expanding.

As a result, formed in the container are the melt of the charge and a skull 1.5 to 2 mm thick. The skull is formed from the non-melted portion of the charge contacting with the walls and bottom of the container.

Grown from the thus obtained melt by the Stockbarger method are both colourless transparent single crystals and coloured transparent single crystals with different generation properties.

To do this, the container with the melt is removed at a certain rate, preferably 2 to 30 mm/h when growing colourless single crystals and 2 to 10 mm/h when growing coloured single crystals, from the charge melting zone, the container being constantly cooled with water throughout the crystallization process.

As the container is being removed from the melting zone, the generator power is reduced at a rate ensuring a constant temperature of the melt surface in the container. The melt is crystallized in the form of single crystal blocks.

The crystallization process being over, the generator is switched off. The thus obtained single crystal blocks are allowed to stay in the water-cooled container to be cooled down to a temperature of no more than 98°C. Then, the blocks are removed from the container, cooled in air, and divided into separate single crystals.

As has been mentioned above, the Stockbarger method permits of obtaining both colourless transparent single crystals and crystals having various colours and different generation properties. Coloured single crystals may also be obtained by introducing into the charge, as it is being prepared, and/or into the melt, prior to growing single crystals, oxides of transition metals or mixtures thereof in an amount of 0.01 to 5% of the charge weight.

Besides, when used as the stabilizer is scandium oxide, samarium oxide, gadolinium oxide, dysprosium oxide, ytterbium oxide or lutecium oxide, coloured single crystals may be obtained by introducing into the charge, as it is being prepared, and/or into the melt, prior to growing single crystals, oxides of rare-earth elements, such as cerium oxide, praseodymium oxide, neodymium oxide, europium oxide, holmium oxide, erbium oxide, thulium oxide or a mixture thereof with oxides of transition metals in an amount of 0.01 to 5% of the charge weight.

Single crystals grown by this method contain 70 to 95 mol.% of zirconium oxide or hafnium dioxide and 30 to 5 mol.% of a stabilizer, feature high microhardness, improved optical quality, and are sufficiently big to find practical use: 0.5 to 4 sq cm in cross section and 1 to 9 cm in height.

The invention will be better understood from the following examples illustrating the preparation of the proposed single crystals.

EXAMPLE 1

A charge was prepared by mixing 1,000 g of powdered zirconium dioxide with 482 g of powdered scandium oxide the content of zirconium dioxide and scandium oxide being in the ratio 70:30, in mol.%).

The thus prepared charge was loaded into a container. The container was in the form of a plurality of water-cooled copper tubes. Prior to melting, 5 g of metallic zirconium powder were locally introduced into the charge (to effect initial melting of the charge). To adjust the composition of the charge, additionally introduced thereinto were 3.26 g of scandium oxide.

The charge was melted in an HF electric field, the container being cooled with water fed into the tubes. Used as the power supply was an HF generator with an operating power of 30 kW and an oscillation frequency of 300 kHz. The charge being completely melted, the temperature at the surface of the melt was 2,800°C.

From the melt obtained in the above fashion, single crystals were grown by the Stockbarger method. To this end, the container with the melt was removed from the charge melting zone at a rate of 30 mm/h, the container being water-cooled throughout the crystallization process. As the container was being removed from the melting zone, the power of the generator was reduced at a rate ensuring a constant temperature at the surface of the melt in the container.

The melt was crystallized in the form of monocrystalline blocks.

The crystallization process being over, the generator was switched off. The resulting monocrystalline blocks were allowed to stay in the water-cooled container to cool down to a temperature of 90°C. Then, the blocks were removed from the container, cooled in air down down to 25°C, and separated into single crystals.

The single crystals thus obtained consisted of zirconium dioxide stabilized with scandium oxide, the ratio therebetween being 70:30 (mol.%). The crystals were transparent and colourless. They featured the following properties: refraction index $n = 2.1$ and a microhardness of 16,000 MN/m$^2$ (the microhardness was measured by the Vickers method, i.e. by pressing a diamond pyramid into the single crystal being tested).

EXAMPLE 2

A charge was prepared by mixing 2,000 g of powdered hafnium dioxide with 824 g of powdered samarium oxide (the ratio therebetween being 80:20, in mol.%).

The resulting charge was loaded into a container which was arranged as a plurality of water-cooled copper tubes.

Prior to melting, 4 g of metallic samarium powder were locally introduced into the charge. To adjust the composition of the charge, additionally introduced thereinto were 11.3 g of hafnium dioxide.

The charge was melted in much the same way as in Example 1 with the difference that the generator used had an operating power of 35 kW and an oscillation frequency of 400 kHz. The charge being completely melted, the temperature at the surface of the melt was 2,850°C.

Monocrystalline blocks were grown from the melt in the same manner as in Example 1, the only difference being that the container was removed from the charge melting zone at a rate of 2 mm/h. The procedure that followed was similar to that of Example 1.

The single crystals obtained in this fashion contained hafnium dioxide stabilized with samarium oxide, the ratio therebetween being 80:20 (mol.%). The crystals were transpararent colourless, and featured the following properties: refraction index $n = 2.0$ and a microhardnenss of 15,000 MN/m$^2$.

EXAMPLE 3

A charge was prepared by mixing 4,000 g of zirconium dioxide with 664 g of powdered europium oxide (zirconium dioxide being in the ratio 95:5, in mol.%, to europium oxide.

The resulting charge was loaded into a container arranged as a plurality of water-cooled cooper tubes.

Prior to melting, locally introduced into the charge were 14 g of powdered metallic zirconium. The composition of the charge was adjusted by the addition thereto of 3.14 g of powdered europium oxide.

The charge was melted as in Example 1 with the difference that the generator used had an operating power of 40 kW and an oscillation frequency of 500 kHz. After the charge has been completely melted, the temperature at the surface of the melt was equal to 2,850°C.

From the melt there were grown monocrystalline blocks in a manner like in Example 1, only in this case the container was removed from the charge melting zone at a rate of 3 mm/h. The steps that followed were similar to those of Example 1.

The single crystals thus obtained contained zirconium dioxide stabilized with europium oxide, the ratio therebetween being 95:5, in mol.%. The single crystals were pinkish cream in colour. They featured: refractive index $n = 2.2$ and a microhardness of 19,000 MN/m$^2$.

Similarly, coloured single crystals based on zirconium dioxide were obtained with oxides of other rare-earth elements being used as the stabilizer. Tabulated below are the types and amounts of the oxides used, as well as the hues of the obtained single crystals.

Table 1

| Stabilizing oxide | Amount of oxide, mol.% | Hue of single crystals |
|---|---|---|
| Tb$_2$O$_3$ | 5 to 30 | brownish green |
| Ho$_2$O$_3$ | 5 to 30 | yellow-green |
| Er$_2$O$_3$ | 5 to 30 | pink |
| Tu$_2$O$_3$ | 5 to 30 | pale green |

As to the rest, the characteristics of these single crystals were similar to those of the single crystals containing europium oxide as the stabilizer.

EXAMPLE 4

A charge was prepared by mixing 2,000 of powdered hafnium dioxide with 388 g of powdered terbium oxide (the ratio therebetween being 90:10, in mol.%).

The resulting charge was loaded into a container which was in the form of a plurality of water-cooled copper tubes.

Prior to melting, 4 g of metallic hafnium powder were locally introduced into the charge. To adjust the composition of the charge, additionally introduced thereinto were 0.92 g of powdered terbium oxide.

The charge was melted as in Example 1 with the difference that the generator used had an operating power of 45 kW and an oscillation frequency of 600 kHz. The charge being completely melted, the temperatures at the surface of the melt was 2,900°C.

Then, grown from the melt were monocrystalline blocks in a manner like in Example 1 with the difference that the container was removed from the charge melting zone at a rate of 5 mm/h. The procedure that followed was similar to that of Example 1.

The single crystals grown in this manner contained hafnium dioxide stabilized with terbium oxide, the ratio therebetween being 90:10 (mol.%). These single crystals were brownish green in colour and featured the following properties: refraction index $n = 2.1$ and a microhardness of 17,000 MN/m$^2$.

In a similar manner, there were obtained coloured single crystals based on hafnium dioxide stabilized with oxides of other rare-earth elements. Given in Table 2 are the types and amounts of the oxides used, as well as the hues of the grown single crystals.

Table 2

| Stabilizing oxide | Amount of oxide, mol.% | Hue of single crystals |
|---|---|---|
| Eu$_2$O$_3$ | 5 to 30 | pinkish cream |
| Ho$_2$O$_3$ | 5 to 30 | yellow-green |
| Er$_2$O$_3$ | 5 to 30 | pink |
| Tu$_2$O$_3$ | 5 to 30 | pale green |

As to the rest, the characteristics of these single crystals were similar to those of the single crystals containing terbium oxide as the stabilizer.

EXAMPLE 5

A charge was prepared by mixing 4,000 g of powdered zirconium dioxide with 1,308 g of powdered gadolinium oxide and 5.3 of ferric oxide (zirconium dioxide being in the ratio 85:15, in mol.%, to gadolinium oxide).

The resulting charge was loaded into a container which was arranged as a plurality of water-cooled copper tubes.

Prior to melting, 9 g of metallic zirconium powder were locally introduced into the charge. The composition of the charge was adjusted by adding 4.07 g of powdered gadolinium oxide thereto.

The charge was melted as in Example 1 with the difference that the HF generator used had an operating power of 50 kW and an oscillation frequency of 1 MNz. The charge being completely melted, the temperature at the surface of the melt was 2,850°C.

Monocrystalline blocks were grown from the melt as in Example 1, the only difference being that the container was removed from the charge melting zone at a rate of 10 mm/h. The steps that followed were similar to those of Example 1.

The single crystals thus obtained consisted of zirconium dioxide, stabilized with gadolinium oxide, and ferric oxide, zirconium dioxide being in the ratio 85:15, (mol.%) to gadolinium oxide, and the content of ferric oxide being 0.1 wt %. These crystals were yellowish in colour and featured: refraction index $n = 2.2$ and a microhardness of 16,000 MN/m$^2$.

Similarly, coloured single crystals were obtained based zirconium dioxide stabilized with gadolinium oxide, with oxides of other transition metals being used as the colouring agent. Summarized in Table 3 are the types and amounts of the oxides used, as well as the hues of the obtained single crystals.

Table 3

| Oxide | Amount of oxide, in % of the total weight of zirconium dioxide and gadolinium oxide | Hue of single crystals |
|---|---|---|
| Co$_2$O$_3$ | 0.01 to 0.5 | dark lilac |
| NiO | 0.1 to 2 | light brown |
| TiO$_2$ | 0.1 to 2 | yellow-brown |
| V$_2$O$_5$ | 0.1 to 1 | greenish |
| Cr$_2$O$_3$ | 0.1 to 1 | olive |
| MnO$_2$ | 0.1 to 1 | brownish purple |
| CuO | 0.1 to 2 | yellowish |

As to the rest, the characteristics of these single crystals were similar to those of the single crystals containing ferric oxide.

EXAMPLE 6

A charge was prepared by mixing 5,000 of powdered hafnium dioxide with 1,330 of powdered dysprosium oxide (the ratio therebetween being 87:13, in mol.%).

The resulting charge was loaded into a container.

Prior to melting, locally introduced into the charge were 10 g of metallic dysprosium powder. To adjust the composition of the charge, it was added with 43 g of powdered hafnium dioxide.

The charge was melted similarly as in Example 1 with the difference that the HF generator had an operating power of 60 kW and an oscillation frequency of 2 MHz. The charge being completely melted, the temperature at the surface of the melt was as high as 2,900°C. Introduced into the melt were 63 g of nickel oxide. Then, monocrystalline blocks were grown from the melt as in Example 1, the only difference being that the container was removed from the charge melting zone at a rate of 4 mm/h. The procedure that followed was similar to that of Example 1.

The thus obtained single crystals consisted of hafnium dioxide, stabilized with dysprosium oxide, and nickel oxide, hafnium dioxide being in the ratio 87:13, in mol.%, to dysprosium oxide, and the content of nickel oxide therein being 1.2 wt %. The single crystals were light brown in colour and featured: refraction index $n = 2.0$ and a microhardness of 17,000 MN/m$^2$.

In a similar manner, coloured single crystals based on hafnium dioxide stabilized with dysprosium oxide were obtained, in which used the colouring agents were oxides of other transition metals. Given below in Table 4 are the types and amounts of the oxides used, as well as the hues of the obtained single crystals.

Table 4

| Oxide | Amount of oxide, in % of the total weight of hafnium dioxide and dysprosium oxide | Hue of single crystal |
|---|---|---|
| Fe$_2$O$_3$ | 0.01 to 0.8 | yellowish |
| Co$_2$O$_3$ | 0.01 to 0.5 | dark lilac |
| TiO$_2$ | 0.1 to 0.2 | yellow-brown |
| V$_2$O$_5$ | 0.1 to 1 | greenish |
| Cr$_2$O$_3$ | 0.1 to 1 | olive |
| MnO$_2$ | 0.1 to 1 | brownish purple |
| CuO | 0.1 to 2 | yellowish |

As to the rest, the characteristics of these single crystals were similar to those of the single crystals containing nickel oxide.

EXAMPLE 7

A charge was prepared by mixing 2,000 g of powdered zirconium dioxide with 782 g of powdered ytterbium oxide and 140 g of neodymium oxide (zirconium dioxide being in the ratio 90:10, in mol.%, to ytterbium oxide). The resulting charge was loaded into a container.

Prior to melting, 11 g of metallic zirconium powder were locally introducted into the charge. To adjust the composition of the charge, additionally introduced thereinto were 5.7 g of powdered ytterbium oxide.

The charge was melted in a manner similar to that of Example 1 with the difference that the generator used had an operating power of 40 kW and an oscillation frequency of 3 MHz. The charge being completely melted, the temperature at the surface of the melt was 2,800°C.

Grown from the melt were monocrystalline blocks as in Example 1 with the difference that the container was removed from the charge melting zone at a rate of 6 mm/h. The steps that followed were similar to those of Example 1.

The obtained single crystals consisted of zirconium dioxide, stabilized with ytterbium oxide, and neodymium oxide, zirconium dioxide being in the ratio 90:10, in mol.%, to ytterbium oxide and the content of neodymium oxide therein being 5 wt %. These crystals were lilac in colour and featured the following properties: refraction index $n = 2.1$ and a microhardness of 18,000 MN/m$^2$.

Similarly, coloured single crystals were grown based on zirconium dioxide stabilized with ytterbium oxide, wherein oxides of other rare-earth elements were used as the stabilizer. The types and amounts of the oxides used, as well as the hues of the obtained single crystals, are given below in Table 5.

Table 5

| Oxide | Amount of oxide, in % of the total weight of zirconium dioxide and ytterbium oxide | Hue of single crystal |
|---|---|---|
| CeO$_2$ | 0.1 to 2 | yellow-orange |
| Ce$_2$O$_3$ | 0.1 to 2 | scarlet |
| Pr$_2$O$_3$ | 0.1 to 2 | amber |
| Eu$_2$O$_3$ | 1 to 3 | pinkish cream |
| Ho$_2$O$_3$ | 0.1 to 5 | yellow-green |
| Er$_2$O$_3$ | 0.01 to 5 | pink |
| Tu$_2$O$_3$ | 1 to 5 | pale green |

As to the rest, the characteristics of these single crystals were similar to those of the single crystals containing neodymium oxide.

EXAMPLE 8

A charge was prepared by mixing 2,000 of powdered hafnium dioxide with 520 g of powdered lutecium oxide (the ratio therebetween being 88:12, mol.%). The resulting charge was loaded into a container.

Prior to melting, 4 g of metallic hafnium powder were locally introduced into the charge. The charge composition was adjusted by additionally introducing thereinto 1.22 g of powdered lutecium oxide.

The charge was melted in a manner like in Example 1 with the difference that the HF generator used had an operating power of 35 kW and an oscillation frequency of 4 MHz. The charge being completely melted, the temperature at the surface of the melt equalled 2,900°C. Added to the melt were 25 g of europium oxide. Then, monocrystalline blocks were grown from the melt as in Example 1 with the difference that the container was removed from the charge melting zone at a rate of 7 mm/h.

The obtained single crystals contained hafnium dioxide, stabilized with lutecium oxide, annd europium oxide, hafnium dioxide being in the ratio 90:10, in mol.%, to lutecium oxide and the content of europium oxide being 0.96 wt %.

These single crystals were pinkish cream in colour and featured: refraction index $n = 2.2$ and a microhardness of 17,000 $MN/m^2$.

In a similar fashion, coloured single crystals based on hafnium dioxide stabilized with lutecium oxide were obtained, in which used as the colouring agent were oxides of other rare-earth elements. Listed in Table 6 are the types and amounts of the oxides used, as well as the hues of the single crystals thus obtained.

Table 6

| Oxide | Amount of oxide, in % of the total weight of hafnium dioxide and lutecium oxide | Hue of single crystal |
| --- | --- | --- |
| $CeO_2$ | 0.1 to 2 | yellow-orange |
| $Ce_2O_3$ | 0.1 to 2 | scarlet |
| $Nd_2O_3$ | 0.01 to 3 | lilac |
| $Pr_2O_3$ | 0.1 to 2 | amber |
| $Ho_2O_3$ | 0.1 to 5 | yellow-green |
| $Er_2O_3$ | 0.1 to 5 | pink |
| $Tu_2O_3$ | 1 to 5 | pale greenish |

As to the rest, the characteristics of these single crystals were similar to those of the single crystals containing europium oxide.

EXAMPLE 9

A charge was prepared by mixing 2,000 g of powdered zirconium dioxide with 724 g of powdered scandium oxide, 13.8 g of powdered nickel oxide and 54.4 g of powdered neodymium oxide (zirconium dioxide being in the ratio 75:25, mol.%, to scandium oxide). The charge was then loaded into a container.

Prior to melting, locally introduced into the charge were 5 g of metallic scandium powder. To adjust the composition of the charge, additionally introduced thereinto were 21.2 g of zirconium dioxide.

The charge was melted as in Example 1, the difference being that the HF generator used had an operating power of 30 kW and an oscillation frequency of 5.28 MHz. The change being completely melted, the temperature at the surface of the melt was 2,850°C.

Grown from the resulting melt were monocrystalline blocks as in Example 1 with the difference that the container was removed from the charge melting zone at a rate of 9 mm/h. The procedure that followed was similar to that of Example 1.

The obtained single crystals consisted of zirconium dioxide, stabilized with scandium oxide, nickel oxide and neodymium oxide, zirconium dioxide being in the ratio 75:25, in mol.%, to scandium oxide and the content of nickel oxide and neodymium oxide being 0.5 and 2 wt %, respectively.

These single crystals were brownish in colour and featured the following properties: refraction index $n = 2.0$ and a microhardness of 15,000 $MN/m^2$.

EXAMPLE 10

A charge was prepared by loading a 1,000 g lump of hafnium dioxide into a container together with a 364 g lump of samarium oxide, 13.6 g of thulium oxide and 27 g of erbium oxide (hafnium dioxide being in the ratio 82:18, mol.%, to samarium oxide).

Prior to melting, 6 g of metallic samarium were added to the charge. The charge composition was adjusted by the addition of 19.2 g of hafnium dioxide thereto.

The charge was melted similarly as in Example 1 with the difference that the HF generator used had an operating power of 25 kW and an oscillation frequency of 10 MHz.

Monocrystalline blocks were grown from the melt in a manner like in Example 1 with the difference that the container was removed from the charge melting zone at a rate of 10 mm/h. The steps that followed were similar to those of Example 1.

The thus obtained single crystals consisted of hafnium dioxide, stabilized with samarium oxide, thulium oxide and erbium oxide, hafnium dioxide being in the ratio 82:18, in mol.%, to samarium oxide, and the content of thulium oxide and erbium oxide being 1 and 2 wt %, respectively.

These single crystals were greenish pink in colour and featured: refraction index $n = 2.1$ and a microhardness of 15,000 $MN/m^2$.

EXAMPLE 11

A charge was prepared by mixing 2,000 g of powdered zirconium dioxide with 332 g of powdered europium oxide and 23.8 g of powdered titanium oxide (zirconium dioxide being in the ratio 95:5, mol.%, to europium oxide). The resulting charge was loaded into a container.

Prior to melting, 7 g of metallic zirconium powder were locally introduced into the charge. To adjust the composition of the charge, additionally introduced thereinto were 1.57 g of powdered europium oxide.

The charge was melted as in Example 1, the only difference being that the HF generator used had an operating power of 30 kW and an oscillation frequency of 2 MHz. The charge being completely melted, the temperature at the surface of the melt was equal to 2,850°C.

From the melt, monocrystalline blocks were grown in a manner like in Example 1 with the difference that the container was removed from the charge melting zone at a rate of 2.5 mm/h.

The single crystals thus obtained consisted of zirconium dioxide, stabilized with europium oxide, and titanium oxide, zirconium dioxide being in the ratio 95:5, in mol.%, to europium oxide, and the content of titanium oxide being 1 wt %.

These single crystals were yellow-brown in colour and featured: refraction index $n = 2.1$ and a microhardness of 16,000 MN/m².

EXAMPLE 12

A charge was prepared by mixing 4,000 g of powdered hafnium dioxide with 776 g of powdered terbium oxide, 47.8 g of nickel oxide and 95.6 g of ferric oxide (hafnium dioxide being in the ratio 90:10, mol.%, to terbium oxide). The resulting charge was loaded into a container.

Prior to melting, locally introduced into the charge were 8 g of metallic hafnium. To adjust the composition of the charge, 1.84 g of powdered terbium oxide were additionally introducted thereinto.

The charge was melted in a manner like in Example 1 with the difference that the operating power of the HF generator used was 45 kW and its oscillation frequency was 5.28 MHz. The charge being completely melted, the temperature at the surface of the melt was equal to 2,900°C.

Grown from the melt were monocrystalline blocks in a manner like in Example 1, the difference being that the container was removed from the charge melting zone at a rate of 3.5 mm/h. The steps that followed were similar to those of Example 1.

The single crystals obtained in the above fashion consisted of hafnium dioxide, stabilized with terbium oxide, nickel oxide and ferric oxide, hafnium dioxide being in the ratio 90:10, in mol.%, to terbium oxide, and the content of nickel oxide and ferric oxide being 1 and 2 wt %, respectively.

These single crystals were yellow-brown in colour and featured the following properties: refraction index $n = 2.0$ and a microhardness of 17,000 MN/m².

EXAMPLE 13

A charge was prepared by mixing 4,000 g of powdered zirconium oxide with 1,448 g of powdered scandium oxide and 27.24 g of powdered erbium oxide (zirconium dioxide being in the ratio 75:25, mol.%, to scandium oxide). The charge was then loaded into a container.

Prior to melting, locally introduced into the charge were 10 g of metallic scandium powder. The composition of the charge was adjusted by the addition thereto of 42.4 g of powdered zirconium dioxide.

The charge was melted similarly as in Example 1 with the difference that the HF generator used had an operating power of 55 kW and an oscillation frequency of 3.2 MHz. The charge being completely melted, the temperature at the surface of the melt was 2,900°C.

From the melt, there were grown monocrystalline blocks as in Example 1 with the difference that the container was removed from the charge melting zone at a rate of 3.5 mm/h. The procedure that followed was similar to that of Example 1.

The grown single crystals consisted of zirconium dioxide, stabilized with scandium oxide, and erbium oxide. In this case, the ratio between zirconium dioxide and scandium oxide was 75:25, in mol.%, and the content of erbium oxide was 0.5 wt %.

These single crystals were pink in colour and featured: refraction index $n = 2.1$ and a microhardness of 17,000 MN/m².

Similarly, coloured single crystals were grown with oxides of other rare-earth elements being used as the colouring agent. Given below is Table 7 listed wherein are the types and amounts of the oxides used, as well as the hues of the single crystals thus obtained.

Table 7

| Oxide | Amount of oxide, in % of the total weight of zirconium dioxide and scandium oxide | Hue of single crystal |
|---|---|---|
| 1 | 2 | 3 |
| $CeO_2$ | 0.1 to 2 | yellow-orange |
| $Ce_2O_3$ | 0.1 to 2 | scarlet |
| $Pr_2O_3$ | 0.1 to 2 | amber |
| $Eu_2O_3$ | 1 to 3 | pinkish cream |
| $Ho_2O_3$ | 0.1 to 5 | yellow-green |
| $Tu_2O_3$ | 1 to 5 | pale greenish |
| $Nd_2O_3$ | 1 to 5 | lilac |

As to the rest, the characteristics of these single crystals were similar to those of the single crystals containing erbium oxide.

EXAMPLE 14

A charge was prepared by mixing 1,000 g of powdered hafnium dioxide with 72.5 g of powdered scandium oxide and 10.72 g of powdered manganese oxide (hafnium dioxide being in the ratio 90:10, mol.%, to scandium oxide). The charge was then loaded into a container.

Prior to melting, 5 g of metallic scandium were locally introduced into the charge. The composition of the charge was adjusted by the addition thereto of 105 g of powdered hafnium dioxide.

The charge was melted as in Example 1 with the difference that the HF generator used had an operating power of 15 kW and an oscillation frequency of 450 kHz. The charge being completely melted, the temperature at the surface of the melt was 2,950°C.

Monocrystalline blocks were grown from the melt as in Example 1, the only difference being that the container was removed from the charge melting zone at a rate of 4 mm/h. The steps that followed were similar to those of Example 1.

The single crystals thus grown consisted of hafnium dioxide, stabilized with scandium oxide, and manganese oxide, hafnium dioxide being in the ratio 90:10, in mol.%, to scandium oxide, and the content of manganese oxide being 1 wt %.

These single crystals were brownish purple in colour and featured the following properties: refraction index $n = 2.0$ and a microhardness of 18,000 MN/m².

Similarly, coloured single crystals were obtained using oxides of other transition metals. Given below in Table 8 are the types and amounts of the oxides used, as well as the hues of the obtained single crystals.

Table 8

| Oxide | Amount of oxide, in % of the total weight of hafnium dioxide and scandium oxide | Hue of single crystal |
|---|---|---|
| $Fe_2O_3$ | 0.01 to 8 | yellowish |
| $Co_2O_3$ | 0.01 to 5 | dark lilac |
| $TiO_2$ | 0.1 to 2 | yellow-brown |
| $V_2O_5$ | 0.1 to 1 | greenish |
| $Cr_2O_3$ | 0.1 to 1 | olive |
| $CuO$ | 0.1 to 2 | yellowish |

As to the rest, the characteristics of these single crystals were similar to those of the single crystals containing manganese oxide.

What is claimed is:

1. Transparent, cubic, single crystals of a stabilized dioxide of a metal selected from the group consisting of zirconium and hafnium, wherein the stabilizer is an oxide of a metal of the formula $R_2O_3$ wherein R is selected from the group consisting of scandium and rare-earth elements selected from the group consisting of samarium, gadolinium, dysprosium, ytterbium, lutecium, thulium, europium, terbium and holmium, with the following content of said components in mol %:

metal dioxide 70–95
stabilizer 30–5 said crystals having a microhardness of 14,000 to 20,000 $MN/m^2$ and a refractive index where $n$ is 2–2.2.

2. Transparent, cubic, single crystals as claimed in claim 1, in which scandium oxide is the stabilizer, and which also contain at least one colorant metal oxide selected from the group consisting of $Co_2O_3$, NiO, $TiO_2$, $V_2O_5$, $Cr_2O_3$, $MnO_2$, CuO, $Fe_2O_3$, $CeO_2$, $Ce_2O_3$, $Pr_2O_3$, $Eu_2O_3$, $Ho_2O_3$, $Er_2O_3$, $Tu_2O_3$ and $Nd_2O_3$ in an amount 0.01 to 5% of the single crystal weight.

3. Transparent, cubic, single crystals as claimed in claim 1, wherein the stabilizer is an oxide of a metal selected from the group consisting of samarium, gadolinium, dysprosium, ytterbium, and lutecium.

4. Transparent, cubic, single crystals as claimed in claim 3, also containing at least one colorant metal oxide selected from the group consisting of $Co_2O_3$, NiO, $TiO_2$, $V_2O_5$, $Cr_2O_3$, $MnO_2$, CuO, $Fe_2O_3$, $CeO_2$, $Ce_2O_3$, $Pr_2O_3$, $Eu_2O_3$, $HO_2O_3$, $Er_2O_3$, $Tu_2O_3$ and $Nd_2O_3$ in an amount of 0.01 to 5% of the single crystal weight.

5. Transparent, cubic, single crystals as claimed in claim 1, wherein the stabilizer is an oxide of a metal selected from the group consisting of thulium, europium, terbium and holmium.

6. Transparent, cubic, single crystals as claimed in claim 5, also containing at least one colorant metal oxide selected from the group consisting of $Co_2O_3$, NiO, $TiO_2$, $V_2O_5$, $Cr_2O_3$, $MnO_2$, CuO, and $Fe_2O_3$ in an amount of 0.01 to 5% of the single crystal weight.

* * * * *